(12) United States Patent
Ootorii

(10) Patent No.: US 9,159,712 B2
(45) Date of Patent: Oct. 13, 2015

(54) LIGHT EMITTING DEVICE-LIGHT RECEIVING DEVICE ASSEMBLY, AND MANUFACTURING METHOD THEREOF

(75) Inventor: Hiizu Ootorii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 519 days.

(21) Appl. No.: 13/410,441

(22) Filed: Mar. 2, 2012

(65) Prior Publication Data
US 2012/0248977 A1 Oct. 4, 2012

(30) Foreign Application Priority Data
Mar. 29, 2011 (JP) ................................ 2011-072401

(51) Int. Cl.
H01S 5/026 (2006.01)
H01L 25/16 (2006.01)
H01L 23/00 (2006.01)

(52) U.S. Cl.
CPC .............. *H01L 25/167* (2013.01); *H01L 24/83* (2013.01); *H01L 24/97* (2013.01); *H01S 5/0262* (2013.01); *H01L 24/29* (2013.01); *H01L 24/32* (2013.01); *H01L 2224/2919* (2013.01); *H01L 2224/32145* (2013.01); *H01L 2224/32225* (2013.01); *H01L 2224/83192* (2013.01); *H01L 2224/83874* (2013.01); *H01L 2224/97* (2013.01); *H01L 2924/12041* (2013.01); *Y10T 29/49002* (2015.01)

(58) Field of Classification Search
CPC ...... G02B 6/4246; H01S 5/0262; H01L 27/12
USPC ......................................................... 313/524
See application file for complete search history.

(56) References Cited

U.S. PATENT DOCUMENTS

| 6,586,776 | B1 * | 7/2003 | Liu ................................ | 257/98 |
| 6,687,268 | B2 * | 2/2004 | Kitamura et al. ............... | 372/22 |
| 6,872,983 | B2 * | 3/2005 | Liu ................................ | 257/80 |
| 7,306,959 | B2 * | 12/2007 | Liu ................................ | 438/21 |
| 7,376,169 | B2 * | 5/2008 | Henrichs ........................ | 372/99 |
| 7,654,750 | B2 * | 2/2010 | Brenner et al. ................. | 385/89 |
| 7,656,926 | B2 * | 2/2010 | Ryu et al. .................. | 372/50.21 |
| 2007/0036493 | A1 * | 2/2007 | Brenner et al. ................. | 385/89 |

FOREIGN PATENT DOCUMENTS

| JP | 2007-079267 | 3/2007 |
| JP | 2010-141087 | 6/2010 |

* cited by examiner

*Primary Examiner* — Thomas A Hollweg
*Assistant Examiner* — Christopher Raabe
(74) *Attorney, Agent, or Firm* — Dentons US LLP

(57) ABSTRACT

A light emitting device-light receiving device assembly includes: a mount substrate having first and second surfaces, and including a first base as a raised portion on the first surface; a light receiving device having first and second surfaces, the first surface of the light receiving device being anchored on the first base; and a light emitting device, the light receiving device including a light passage portion allowing for passage of light emitted by the light emitting device, the light emitted by the light emitting device emerging to outside through the light passage portion, the first base, and the mount substrate, the light receiving device receiving externally incident light through the mount substrate and the first base, the light receiving device including an annular second base as a raised portion on the second surface of the light receiving device, and the light emitting device being anchored on the second base.

11 Claims, 10 Drawing Sheets

[STEP-110]

[STEP-110] (CONTINUED)

[STEP-120] (CONTINUED)

[STEP-120J (CONTINUED)]

LIGHT EMITTING DEVICE-LIGHT RECEIVING DEVICE ASSEMBLY, AND MANUFACTURING METHOD THEREOF

FIELD

The present disclosure relates to a light emitting device-light receiving device assembly, and to a manufacturing method thereof.

BACKGROUND

A transfer technique is known that transfers various optical devices fabricated on a substrate to amount substrate in a different pitch, as described in, for example, JP-A-2010-141087.

This transfer method includes:

retaining a plurality of devices on a temporary retaining substrate as a cluster of individual devices while maintaining a first pitch at which the devices are fabricated on a device-forming substrate;

obtaining a device disposing substrate by forming a plurality of device mounting bases on the principal surface in a second pitch determined to be an integer multiple of the first pitch, the device mounting bases having a surface shape of a size smaller than the first pitch, and a seating face slightly raised from the surrounding principal surface of the substrate;

disposing an uncured adhesive layer on the seating face of the device mounting bases;

closing the distance between the opposing principal surfaces of the temporary retaining substrate and the device disposing substrate so as to contact some of the plurality of devices to the uncured adhesive layer;

curing the uncured adhesive layer so as to anchor the some devices in contact with the adhesive layer on the device mounting base; and separating the temporary retaining substrate and the device disposing substrate from each other without detaching the some devices in contact with the adhesive layer on the device mounting base.

On the other hand, an optical transmitter/receiver as a laminate of a surface-emitting device and a light receiving device is known that is attached to the both ends of an optical fiber used in a bidirectional optical transmitting and receiving system, as described in, for example, JP-A-2007-079267.

The optical transmitting and receiving device includes:

a first base material having a surface-emitting device formed on its top surface;

a second base material provided on the first base material and having a light receiving device formed on its top surface;

an emission window provided for the light receiving device, and through which the light emitted by the surface-emitting device emerges; and a light passage portion provided between the emission window and the surface-emitting device.

SUMMARY

In the technique disclosed in JP-A-2007-079267, the light emitting device and the light receiving device are laminated. Specifically, a first base material 12 having a surface-emitting device 16, and a second base material 14 having a light receiving device 18 are laminated in a laminating and joining step after being separately fabricated. However, the surface-emitting device 16 and the light receiving device 18 are not integral, and are laminated via the second base material 14. This makes it difficult to reduce the size and thickness of the layer formed by the surface-emitting device 16 and the light receiving device 18. In the technique disclosed in JP-A-2010-141087, the devices are configured from light emitting devices or light receiving devices, and the publication does not describe anything about a device as an integral unit of the light emitting device and the light receiving device. Further, in practice, it is extremely difficult to transfer the optical transmitter/receiver as a laminate of the surface-emitting device 16 and the light receiving device 18 disclosed in JP-A-2007-079267 to a mount substrate using the technique disclosed in JP-A-2010-141087.

Accordingly, there is a need for a light emitting device-light receiving device assembly as an integral unit of a light emitting device and a light receiving device. There is also a need for a light emitting device-light receiving device assembly manufacturing method by which a light emitting device-light receiving device assembly as an integral unit of a light emitting device and a light receiving device can be obtained by the transfer of the light emitting device and the light receiving device to a mount substrate.

An embodiment of the present disclosure is directed to a light emitting device-light receiving device assembly that includes:

a mount substrate that has a first surface and a second surface opposite the first surface, and that includes a first base provided as a raised portion on the first surface;

a light receiving device that has a first surface and a second surface opposite the first surface, the first surface of the light receiving device being anchored on the first base; and a light emitting device, the light receiving device including a light passage portion that allows for passage of light emitted by the light emitting device, the light emitted by the light emitting device emerging to outside through the light passage portion of the light receiving device, the first base, and the mount substrate, the light receiving device receiving externally incident light through the mount substrate and the first base, the light receiving device including an annular second base provided as a raised portion on the second surface of the light receiving device, and the light emitting device being anchored on the second base.

Another embodiment of the present disclosure is directed to a method for manufacturing the light emitting device-light receiving device assembly of the foregoing embodiment, the method including:

preparing the mount substrate that includes the first base provided in a first pitch $P_1$;

preparing a light receiving device temporarily fastening substrate to which the second surface of the light receiving device is temporarily fastened in a second pitch $P_2$ ($m \cdot P_2 = P_1$, where $m_2$ is a positive integer);

preparing a light emitting device temporarily fastening substrate to which the light emitting device is temporarily fastened in a third pitch $P_3$ ($m_3 \cdot P_3 = P_1$, where $m_3$ is a positive integer);

disposing the first surface of every $m_2$ light receiving devices (in other words, the first surfaces of the light receiving devices separated by ($m_2-1$) light receiving devices) on the first base, and removing the disposed light receiving devices from the light receiving device temporarily fastening substrate; and disposing every $m_3$ light emitting devices (in other words, the light emitting devices separated by ($m_3-1$) light emitting devices) on the second base provided on the second surface of the light receiving device, and removing the disposed light emitting devices from the light emitting device temporarily fastening substrate.

A device incorporating the light emitting device-light receiving device assembly can be obtained by cutting and dividing the mount substrate into a predetermined shape after these steps. As required, a plurality of integral structures of the light emitting device and the light receiving device may be provided by being arranged on a single mount substrate, or a plurality of mounts substrates cut and divided into a predetermined shape may be connected to each other.

In the light emitting device-light receiving device assembly and the manufacturing method thereof according to the embodiments of the present disclosure, the first base (raised portion) is provided on the first surface of the mount substrate, and thus every $m_2$ light receiving devices can be reliably mounted on the first base. Here, the light receiving device can be mounted while preventing the adjacent light receiving devices from contacting the first surface of the mount substrate. Similarly, because the annular second base (raised portion) is provided on the second surface of the light receiving device, every $m_3$ light emitting devices can be reliably mounted on the second base while preventing the adjacent light emitting devices from contacting the second surface of the light receiving device. In this way, a light emitting device-light receiving device assembly as an integral unit of the light emitting device and the light receiving device can be stably manufactured at high yield. Further, because the light emitting device and the light receiving device are provided as an integral unit, the light emitting device-light receiving device assembly can be reduced in size and thickness.

Further, because the light receiving device and the light emitting device are temporarily fastened (retained) to a temporary fastening substrate, the light receiving device and the light emitting device can be easily adjusted in orientation, reduced in thickness, and divided into individual pieces, for example. Further, every $m_2$ light receiving devices, and every $m_3$ light emitting devices can be transferred at once to the mount substrate.

Further, because the mount substrate can be provided in a size for actual use with the integral unit of the light emitting device and the light receiving device, the mount substrate can directly be used as a device, or can easily be used to mount electrical devices such as an active device and a passive device and provide an electronic device by adding an additional step of forming wires and electrodes.

DETAILED DESCRIPTION

Figure 1:
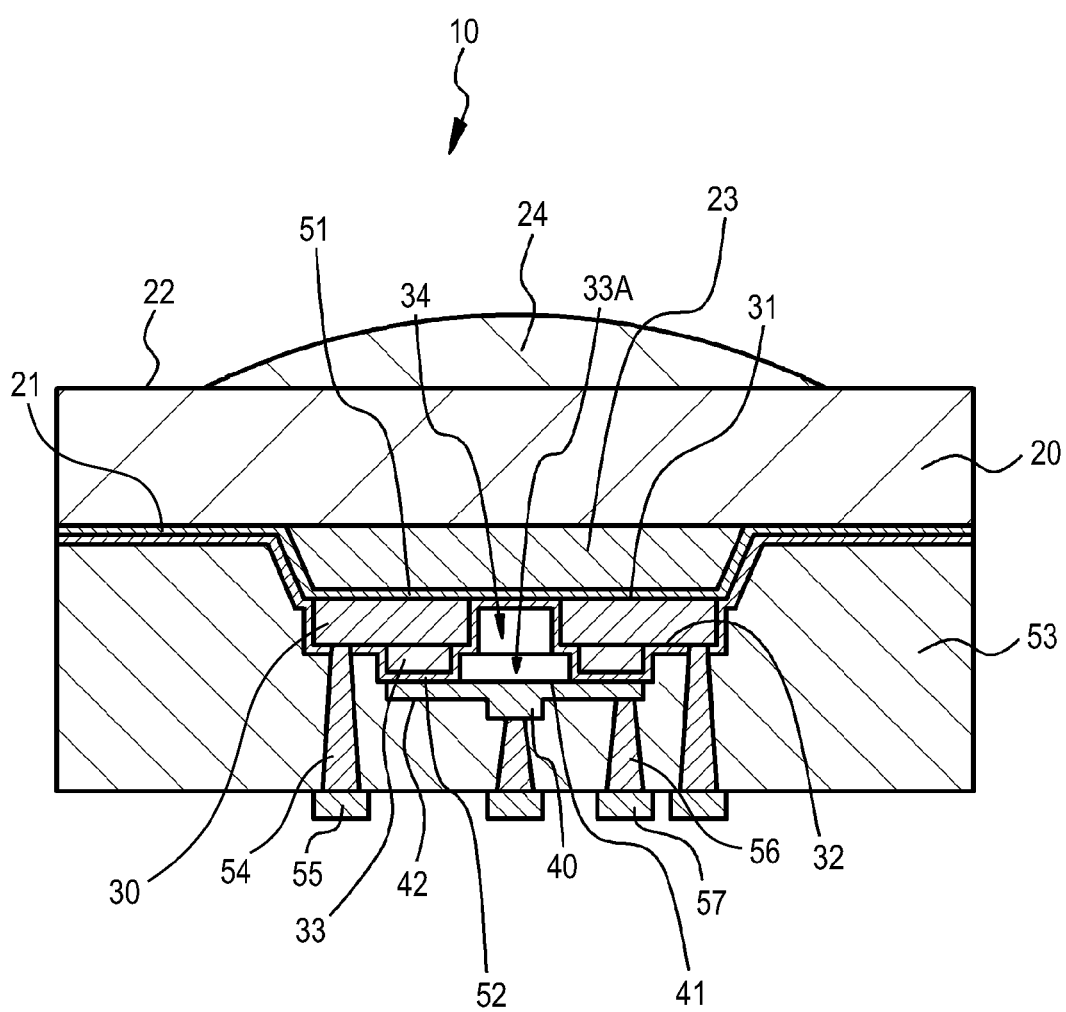
FIG. 1 is a schematic cross sectional view of a light emitting device-light receiving device assembly of Example 1.

The following will describe the present disclosure based on embodiments and examples, with reference to the accompanying drawings. It should be noted that the present disclosure is not limited to the following embodiments and examples, and the numerical values and materials presented in the following embodiments and examples are illustrative. Descriptions will be given in the following order.

1. Overall descriptions, including a light emitting device-light receiving device assembly and a manufacturing method thereof of embodiments of the present disclosure 2. Example 1 (light emitting device-light receiving device assembly, and manufacturing method thereof)

3. Example 2 (variation of Example 1), other

In the light emitting device-light receiving device assembly manufacturing method according to a preferred embodiment of the present disclosure, the step of preparing a light receiving device temporarily fastening substrate may include:

fabricating a light receiving device on a light receiving device fabrication substrate;

temporarily fastening a second surface of the light receiving device to a light receiving device temporarily fastening substrate in a second pitch $P_2$; and removing the light receiving device fabrication substrate to expose a first surface of the light receiving device.

Note that the light receiving device should be fabricated on the light receiving device fabrication substrate preferably in the second pitch $P_2$, though the pitch is not limited thereto.

In the light emitting device-light receiving device assembly manufacturing method including the foregoing preferred embodiment of the present disclosure, the step of preparing a light emitting device temporarily fastening substrate may include:

fabricating a light emitting device on a light emitting device fabrication substrate;

temporarily fastening a second surface of the light emitting device to a light emitting device temporarily fastening substrate in a third pitch $P_3$; and removing the light emitting device fabrication substrate to expose a first surface of the light emitting device.

Note that the light emitting device should be fabricated on the light emitting device fabrication substrate preferably in the third pitch $P_3$, though the pitch is not limited thereto.

Further, in the light emitting device-light receiving device assembly manufacturing method including the foregoing preferred embodiments of the present disclosure, the step of disposing the first surface of every $m_2$ light receiving devices on a first base and removing the light receiving devices so disposed from the light receiving device temporarily fastening substrate may include:

forming a transmissive first adhesive layer at least on the first base;

disposing the light receiving device on the first base by mounting the light receiving device on the first adhesive layer formed on the first base; and separating the light receiving device so disposed from the light receiving device temporarily fastening substrate.

Note that the transmissive first adhesive layer may be formed on the first base and the first surface of a mount substrate (specifically, over the whole surface).

Further, in the light emitting device-light receiving device assembly manufacturing method including the foregoing preferred embodiments of the present disclosure, the step of disposing every $m_3$ light emitting devices on a second base provided on the second surface of the light receiving device and removing the light emitting devices so disposed from the light emitting device temporarily fastening substrate may include:

forming a second adhesive layer at least on the second base;

disposing the light emitting device on the second base by mounting the light emitting device on the second adhesive layer formed on the second base; and separating the light emitting device so disposed from the light emitting device temporarily fastening substrate.

Note that the second adhesive layer may be formed over the second base and the first surface of the mount substrate (specifically, over the whole surface).

The first adhesive layer and the second adhesive layer (also collectively referred to as "anchor material layer") may be formed using basically any material, as long as it can be cured or solidified by using some method. Examples of such materials include materials that can be cured or solidified by irradiation of energy rays such as light (particularly, ultraviolet rays and the like), radiation (x rays and the like), and electron beams; and materials that can be cured or solidified by application of, for example, heat or pressure. A resin layer, particularly photosensitive resin, heat curable resin, and thermoplastic resin are examples of materials that can be easily formed and easily cured or solidified. Known photosensitive resins can be used. Specific examples include negative compounds, such as poly(vinyl cinnamate) and polyvinyl azidobenzal that become poorly soluble at the exposed portion by undergoing photocrosslinking reaction, and acrylamide that becomes poorly soluble at the exposed portion by undergoing photopolymerization reaction, and positive compounds, such as o-quinone diazide novolac resin, that become readily soluble with the carboxylic acid produced by the photodegradation of the quinone diazide group. Known heat curable resins may be used. Specific examples include epoxy resin, phenol resin, urea resin, melamine resin, unsaturated polyester resin, polyurethane resin, and polyimide resin. Known thermoplastic resins may be used. Specific examples include polyethylene resin, polystyrene resin, polyvinyl chloride resin, and polyamide resin. For example, when using a photosensitive resin layer, the anchor material layer can be cured by being irradiated with light or ultraviolet rays. Further, when using a heat-curable resin layer, the anchor material layer can be cured by being heated on a hot plate or in an oven, for example. Further, when using a thermoplastic resin layer, a part of the anchor material layer may be selectively heated and melted by, for example, irradiation of light to provide fluidity. Further, the anchor material layer may be, for example, a pressure-sensitive resin layer (for example, such as acrylic resin), a metal (a simple metal and an alloy), or glass. Note that soldering of the light emitting device-light receiving device assembly requires the anchor material layer to be formed of heat-resistant material that can withstand high temperatures (160 to 300° C. range) near the melting point of the solder. The anchoring of the light receiving device to the first base with the first adhesive layer may be performed before or after removing the disposed light receiving device from the light receiving device temporarily fastening substrate, and may be appropriately decided in a manner that depends on the first adhesive layer. Further, the anchoring of the light emitting device to the second base with the second adhesive layer may be performed before or after removing the disposed light emitting device from the light emitting device temporarily fastening substrate, and may be appropriately decided in a manner that depends on the second adhesive layer.

The anchor material layer may be formed using methods, for example, such as a coating method (spin coating), and a printing method (including contact printing, imprinting, screen printing, gravure printing, and offset printing).

In the light emitting device-light receiving device assembly of the embodiments of the present disclosure, or in the light emitting device-light receiving device assembly manufacturing method including the foregoing preferred embodiments of the present disclosure, the second base may be configured from a metal layer or an alloy layer (for example, a copper layer), and may be formed by using methods, for example, such as physical vapor deposition methods (including a sputtering method and a vacuum vapor deposition method), a lift-off method, and a plating method. Alternatively, the second base may be formed by etching the second surface of the light receiving device, or by patterning an insulating layer or the like formed on the second surface of the light receiving device, using a photolithography technique and an etching technique.

In the light emitting device-light receiving device assembly including the foregoing preferred configurations of the present disclosure, or in the light emitting device-light receiving device assembly manufacturing method including the foregoing preferred embodiments and configurations of the present disclosure, the light emitting device may be realized preferably by, for example, a semiconductor laser (including a surface-emitting laser device (vertical cavity surface emitting laser; VCSEL)), an light-emitting diode, or an electroluminescence (EL) device. In this case, the surface-emitting laser device is preferably a bottom-emission surface-emitting laser device. Other examples of the light receiving device include a photodiode, a CCD sensor, and a MOS sensor. Further, the light emitting device and the light receiving device may be used in combination, for example, such as in a combination of an LED and a MOS sensor.

Further, the light emitting device-light receiving device assembly including the foregoing preferred configurations of the present disclosure, or the light emitting device-light receiving device assembly manufacturing method including the foregoing preferred embodiments and configurations of the present disclosure may be adapted so that a lens is provided on the second surface of the mount substrate, wherein the light emitted by the light emitting device emerges to outside through the light passage portion of the light receiving device, the first base, the mount substrate, and the lens, and wherein the externally incident light falls on the light receiving device through the lens, the mount substrate, and the first base. In this case, a light reflecting member may be provided at a central portion of the lens so that a part of the light emitted by the light emitting device emerges to outside through the light passage portion of the light receiving device, the first base, the mount substrate, and the lens, and that the remaining light from the light emitting device is reflected by the light reflecting member into the light receiving device through the mount substrate and the first base. With these configurations, the quantity of the emitted light from the light emitting device can be monitored at the light receiving device, and the light emitting device-light receiving device assembly can have an auto power detecting (APD) function. Note that providing the light reflecting member at a central portion of the lens includes forming a light reflecting layer at a central portion of the lens. Examples of the materials of the light reflecting member and the light reflecting layer include aluminum (Al), silver (Ag), and alloys of these. In some cases, the APD function can be provided by the interface reflection (in principle, about 5%) that occurs at the interface between the lens and the atmosphere, without providing the light reflecting member. Further, in the light emitting device-light receiving device assembly including the foregoing embodiments and configurations of the present disclosure, or in the light emitting device-light receiving device assembly manufacturing method of the embodiments of the present disclosure, it is desirable that the center (light axis) of the lens coincide with the center (axis line) of the light receiving device and the light emitting device. It is also desirable that the light axis of the lens coincide with the axis line of the first base.

Further, in the light emitting device-light receiving device assembly including the foregoing preferred embodiments and configurations of the present disclosure, or in the light emitting device-light receiving device assembly manufacturing method including the foregoing preferred embodiments and configurations of the present disclosure, it is preferable that the first base have the same outer shape as the first surface of the light receiving device, and that the second base have the same outer shape as the first surface of the light emitting device, though the shapes of the first and second bases are not limited thereto. When the first adhesive layer and the second adhesive layer are thick layers, it may be preferable to make the surface shapes of the first and second bases smaller than the surface shapes of the light receiving device and the light emitting device, taking into consideration the extent to which the first adhesive layer and the second adhesive layer may stick out under the applied pressure.

Further, in the light emitting device-light receiving device assembly including the foregoing preferred configurations of the present disclosure, it is preferable that the first surface of the light receiving device be anchored on the first base with the transmissive first adhesive layer, and that the light emitting device be anchored on the second base with the second adhesive layer.

In the light emitting device-light receiving device assembly including the foregoing preferred configurations of the present disclosure, or in the light emitting device-light receiving device assembly manufacturing method including the foregoing preferred embodiments and configurations of the present disclosure (hereinafter, these will also be collectively referred to simply as "the present disclosure"), the size of the first base is preferably, but is not limited to, less than the second pitch $P_2$. Further, the size of the second base is preferably, but is not limited to, less than the third pitch $P_3$. Preferably, the height of the first base is greater than the thickness of the first adhesive layer formed on the first surface of the mount substrate. Specifically, the seating face of the first base is preferably on a higher level than the surface of the first adhesive layer formed on the first surface of the mount substrate. Further, it is preferable that the height of the second base be greater than the thickness of the second adhesive layer formed on the second surface of the light receiving device. Specifically, the seating face of the second base is preferably on a higher level than the surface of the second adhesive layer formed on the second surface of the light receiving device.

In the embodiment of the present disclosure, the first base may be formed by etching the first surface of the mount substrate. Alternatively, the mount substrate with the first base may be molded by injection molding. Further, the first base may be formed by patterning a UV curable resin layer (for example, acrylic resin VPA series; Nippon Steel Chemical Co., Ltd.) formed and cured on the first surface of the mount substrate, or by curing the UV curable resin layer formed and patterned on the first surface of the mount substrate. The first base also can be formed by patterning a resin layer of, for example, polyimide resin or SOG (Spin-On-Glass) by using a photolithography technique or an etching technique after forming the resin layer on the first surface of the mount substrate. Note that, because the incidence and emission of light occurs through the first base, the first base needs to be transmissive for the incident and emission rays. Further, in the case of soldering the light emitting device-light receiving device assembly, the first base material needs to be a heat-resistant material that can withstand high temperatures (160 to 300° C. range) near the melting point of the solder. The lens on the second surface of the mount substrate may be fabricated or configured using known materials according to known methods. In some cases, the mount substrate and the lens may be fabricated as an integral unit. Further, a protection wall may be provided around the lens to protect the lens. This reduces the chance of the lens being damaged by accidental contact. The protection wall should be thicker than the lens thickness. The mount substrate may be, for example, a glass substrate or a transparent plastic substrate.

In the embodiment of the present disclosure, the light receiving device fabrication substrate and the light emitting device fabrication substrate may be substrates suited for the manufacture of the light receiving device and the light emitting device. Examples include a sapphire substrate, a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and a Ge substrate. These may include an underlayer or a buffer layer formed on the substrate surface (principal surface). The light receiving device and the light emitting device may have known configurations or structures. The layers forming the light receiving device and the light emitting device may be formed of compound semiconductors, for example, such as GaN compound semiconductors (including AlGaN mixed crystal or AlInGaN mixed crystal, and InGaN mixed crystal), InN compound semiconductors, AlN compound semiconductors, GaAs compound semiconductors, AlGaAs compound semiconductors, AlGaInP compound semiconductors, AlGaInAs compound semiconductors, GaInAs compound semiconductors, GaInAsP compound semiconductors, GaP compound semiconductors, and InP compound semiconductors. These layers may be formed by using (deposition) methods such as the metal organic chemical vapor deposition method (MOCVD method), the molecular beam epitaxy method (MBE method), and the hydride vapor phase epitaxy method that uses halogen contributing to the transport or reaction. The manufacturing method of the light receiving device or the light emitting device in itself may be a known manufacturing method.

Examples of the light emitting device temporarily fastening substrate and the light emitting device temporarily fastening substrate include a glass substrate, a quartz substrate, a metal substrate, an alloy substrate, a ceramic substrate, and a plastic substrate. Examples of the method for temporarily fastening the light receiving device or the light emitting device to the light emitting device temporarily fastening substrate or the light emitting device temporarily fastening substrate include a method using an adhesive (for example, a method using a silicone resin tacky agent), a metal bonding method, a semiconductor bonding method, and a metal-semiconductor bonding method. Examples of the method for removing the light receiving device fabrication substrate or the light emitting device fabrication substrate include wet etching methods and dry etching methods. The wet etching methods may use, for example, ammonia solution+hydrogen peroxide solution, sulfuric acid solution+hydrogen peroxide solution, hydrochloric acid solution+hydrogen peroxide solution, or phosphoric acid solution+hydrogen peroxide solution. Further, examples of the method for removing the disposed light receiving device from the light receiving device temporarily fastening substrate, and the method for removing the disposed light emitting device from the light emitting device temporarily fastening substrate include a method that takes advantage of the adhesion between the anchor material layer and the light receiving device or the light emitting device, a laser abrasion method, a lift-off method using a laser, and a heating method. Examples of the method for separating the multiple light emitting device-light receiving device assemblies into individual light emitting device-light receiving device assemblies include a wet etching method, a dry etching method, laser irradiation, and dicing.

Examples of the products obtained by mounting the light emitting device-light receiving device assembly include optical transmitting and receiving devices and optical transmitting and receiving devices that have various applications such as between electronic devices, between electronic device boards, and, in particular, between semiconductor chips within a board. Such products can be used to construct high-speed, high-density, and low-cost optical transmission-optical communications systems and bidirectional optical transmitting and receiving systems. Other examples include sensors that have light emitting and receiving functions.

Example 1

Figure 2A:
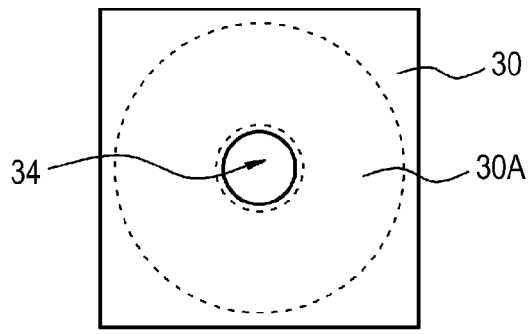
FIGS. 2A, 2B, and 2C are a schematic plan view of a light receiving device, a schematic plan view of a second base portion, and a schematic plan view of a light emitting device, respectively, in the light emitting device-light receiving device assembly of Example 1.
Figure 2B:
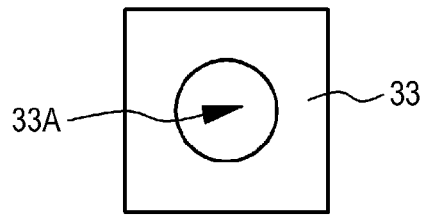
Figure 2C:
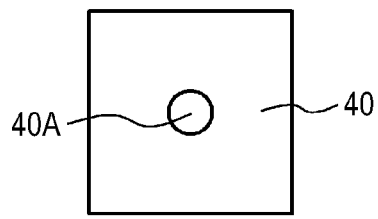

Example 1 is concerned with the light emitting device-light receiving device assembly and the manufacturing method thereof of the present disclosure. FIG. 1 is a schematic cross sectional view of the light emitting device-light receiving device assembly of Example 1. FIG. 2A is a schematic plan view of a light receiving device, FIG. 2B is a schematic plan view showing a second base portion, and FIG. 2C is a schematic plan view of a light emitting device.

A light emitting device-light receiving device assembly 10 of Example 1 includes amount substrate 20, alight receiving device 30, and a light emitting device 40. The mount substrate 20 has a first surface 21, and a second surface 22 opposite the first surface 21. A first base 23 (raised portion) is formed on the first surface 21. Note that, in Example 1, a lens 24 is provided on the second surface 22 of the mount substrate 20. The provision of the lens 24 is optional. The light receiving device 30 has a first surface 31, and a second surface 32 opposite the first surface 31. The first surface 31 is anchored on the first base 23. The light emitting device 40 has a first surface 41, and a second surface 42 opposite the first surface 41. The light receiving device 30 includes a light passage portion 34 that passes the light emitted by the light emitting device 40. The light emitted by the light emitting device 40 emerges to outside through the light passage portion 34 of the light receiving device 30, the first base 23, and the mount substrate 20 (more specifically, in Example 1, through the light passage portion 34 of the light receiving device 30, the first base 23, the mount substrate 20, and the lens 24). On the other hand, the externally incident light falls on the light receiving device 30 through the mount substrate 20 and the first base 23 (more specifically, in Example 1, through the lens 24, the mount substrate 20, and the first base 23). Further, an annular second base 33 (raised portion) is provided on the second surface 32 of the light receiving device 30, and the light emitting device 40 is anchored on the second base 33.

Specifically, the mount substrate 20 is a glass substrate, and the lens 24 is fabricated from transparent resin using known methods. The light receiving device 30 is realized by a photodiode, whereas the light emitting device 40 is formed as a surface-emitting laser device (vertical cavity surface emitting laser; VCSEL), more specifically a bottom-emission surface-emitting laser device. The first base 23 (raised portion) is formed by etching the first surface 21 of the mount substrate 20 (glass substrate), though the method is not limited thereto. The annular second base 33 (raised portion) provided on the second surface 32 of the light receiving device 30 is, but is not limited to, for example, a copper layer formed by using methods such as plating and sputtering.

The first base 23 has the same outer shape as the first surface 31 of the light receiving device 30, specifically a square outer surface shape. The second base 33 has the same outer shape as the first surface 32 of the light emitting device 40, specifically a square outer surface shape. The center of the lens 24 coincides with the center of the light receiving device 30 and the light emitting device 40. The lens 24 can collimate the emitted light to prevent it from spreading, and can condense the incident light on the light receiving device 30.

The first surface 31 of the light receiving device 30 is anchored on the first base 23 with a transmissive first adhesive layer 51. The light emitting device 40 is anchored on the second base 33 with a second adhesive layer 52.

The light receiving device 30 and the light emitting device 40 forming the light emitting device-light receiving device assembly 10 is covered with an insulating layer 53. The p-side and n-side electrodes (not illustrated in FIG. 1) of the photodiode forming the light receiving device 30 are connected to an external circuit via a connection hole 54 and a pad portion 55 provided for the insulating layer 53. Similarly, a p-side electrode 145 and an n-side electrode 144 (see FIG. 2D) of the surface-emitting laser device forming the light emitting device 40 are connected to an external circuit via a connection hole 56 and a pad portion 57 provided for the insulating layer 53.

The light emitting device-light receiving device assembly manufacturing method of Example 1 is described below with reference to FIG. 4 to FIG. 10 that show partial cross section views of the mount substrate and other components.

[Step-100]

First, the mount substrate 20 is prepared that has the first base 23 formed in a first pitch $P_1$. Specifically, the first base 23 is formed on the first surface 21 of the mount substrate 20 (glass substrate) using a lithography technique and an etching technique. The lens 24 is formed on the second surface 22 of the mount substrate 20 in the first pitch $P_1$ using a known method. The light axis of the lens 24 coincides with the axis line of the first base 23. Then, the transmissive first adhesive layer 51 as a UV curable adhesive is formed at least on the first base 23. In Example 1, specifically, the transmissive first adhesive layer 51 is formed on the first base 23 and the first surface 21 of the mount substrate 20 (over the whole surface) using spin coating. The result is the state shown in FIG. 4. The UV curable adhesive can be cured at ordinary temperature, and is advantageous in terms of preventing misregistration due to temperature changes. Note that the light receiving device 30 may be disposed only on a specific first base 23 by applying the first adhesive layer 51 only on a specific first base 23 using methods such as a printing method. The first base 23 and the lens 24 are formed on the mount substrate 20 in a two-dimensional matrix. In Example 1, the first base 23 and the lens 24 are formed in the first pitch $P_1$, both in the X and Y directions. The first base 23 and the lens 24 may be formed in different pitches P'1 and P"1 (P'1≠P"1) in the X and Y directions.

A light receiving device temporarily fastening substrate 60 is prepared to which the second surface 32 of the light receiving device 30 is temporarily fastened (temporarily anchored) in the second pitch $P_2$ ($m_2 \cdot P_2 = P_1$, where $m_2$ is a positive integer; $m_2=3$ in the example shown). Specifically, the light receiving device 30 (photodiode) is fabricated on a light receiving device fabrication substrate (not illustrated) using a known method. More specifically, an n-type semiconductor layer is formed on the light receiving device fabrication substrate using a CVD method, and a p-type semiconductor layer is formed by ion implantation in a surface region of the n-type semiconductor layer. FIG. 2A shows a schematic plan view of the light receiving device finally obtained. A ring-shaped p-type semiconductor layer 30A is indicated by a dotted line. After forming an insulating layer (not illustrated) on the surface, a copper layer is formed on the p-type semiconductor layer 30A (specifically, on the insulating layer) using a plating method. The annular second base 33 is then formed on the light receiving device 30 using a lithography technique and an etching technique. FIG. 2B shows a schematic plan view of the annular second base 33, in which the inner hollow portion is denoted by reference numeral 33A. Thereafter, a hole portion (light passage portion 34) is formed in the p-type semiconductor layer and the n-type semiconductor layer by etching. The light receiving device 30 is fabricated on the light receiving device fabrication substrate in a second pitch $P_2$. Note that the light receiving device 30 may be formed in different pitches P'2 and P"2 (P'2≠P"2) in the X and Y directions, instead of the second pitch in the both X and Y directions. The outermost surface of the light receiving device 30 formed on the light receiving device fabrication substrate corresponds to the second surface 32. The second surface 32 of the light receiving device 30 is then temporarily fastened to the light receiving device temporarily fastening substrate 60 in the second pitch $P_2$. The light receiving device temporarily fastening substrate 60 has a tacky layer 61 formed of silicone resin, and the light receiving device 30 is temporarily fastened to the light receiving device temporarily fastening substrate 60 with the light receiving device fabrication substrate via the tacky layer 61. The boundary region between the light receiving devices 30 is then removed by etching, and, after forming an isolation region 62, the first surface 31 of the light receiving device 30 is exposed by removing the light receiving device fabrication substrate, specifically by etching the light receiving device fabrication substrate. The result is the state shown in FIG. 4.

Figure 2D:
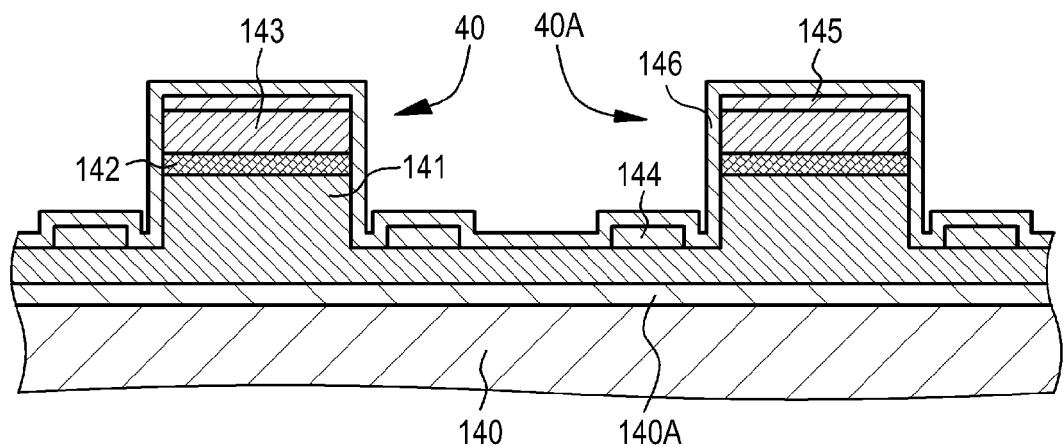
FIG. 2D is a schematic partial cross sectional view of a plurality of light emitting devices.

Further, a light emitting device temporarily fastening substrate 70 is prepared to which the light emitting device 40 is temporarily fastened (temporarily anchored) in a third pitch $P_3$ ($m_3 \cdot P_3 = P_1$, where $m_3$ is a positive integer; $m_3=5$ in the example shown). Specifically, the light emitting device 40 as a surface-emitting laser device (VCSEL) is fabricated on a light emitting device fabrication substrate 140 using a known method. More specifically, as illustrated in FIG. 2D, an n-type compound semiconductor layer 141 (including an etching stopper layer 140A, a buffer layer, an n-type DBR (distributed Bragg reflector) layer, and an n-type clad layer), a compound semiconductor active layer 142, and a p-type compound semiconductor layer 143 (including a p-type clad layer, a p-type DBR layer, and a p-type contact layer) are successively deposited on the light emitting device fabrication substrate 140 using a MOCVD method, and, after an activation process, the p-side electrode 145 is formed by sputtering. The p-side electrode 145, the p-type compound semiconductor layer 143, the active layer 142, and a part of the n-type compound semiconductor layer 141 are etched to form a columnar mesa structure 40A. This produces the current confined path effect. The n-side electrode 144 is then formed on the n-type compound semiconductor layer 141 so exposed, and an insulating layer 146 is formed on the whole surface. This completes the light emitting device 40 shown in FIG. 2D. The light emitting device 40 is fabricated on the light emitting device fabrication substrate 140 in the third pitch $P_3$. Note that the light emitting device 40 may be formed in different pitches P'3 and P"3 (P'3≠P"3) in the X and Y directions, instead of the third pitch $P_3$ in the both X and Y directions. The top surface of the light emitting device 40 corresponds to the second surface 42. The second surface 42 of the light emitting device 40 is then temporarily fastened to the light emitting device temporarily fastening substrate 70 in the third pitch $P_3$. The light emitting device temporarily fastening substrate 70 has a tacky layer 71 formed of silicone resin, and the light emitting device 40 is temporarily fastened to the light emitting device temporarily fastening substrate 70 with the light emitting device fabrication substrate 140 via the tacky layer 71. The boundary region between the light emitting devices 40 is then removed by etching, and, after forming an isolation region 72, the first surface 41 of the light emitting device 40 is exposed by removing the light emitting device fabrication substrate 140, specifically, by etching the light emitting device fabrication substrate 140 to the etching stopper layer 140A. The result is the state shown in FIG. 8. The light emitting device 40 emits a laser beam to outside through the n-type compound semiconductor layer 141. That is, the light emitting device 40 is a bottom-emission surface-emitting laser device.

[Step-110]

The first surface 31 of every $m_2$ light receiving devices 30 is disposed on the first base 23, and the light receiving devices 30 so disposed are removed from the light receiving device temporarily fastening substrate 60.

Figure 4:
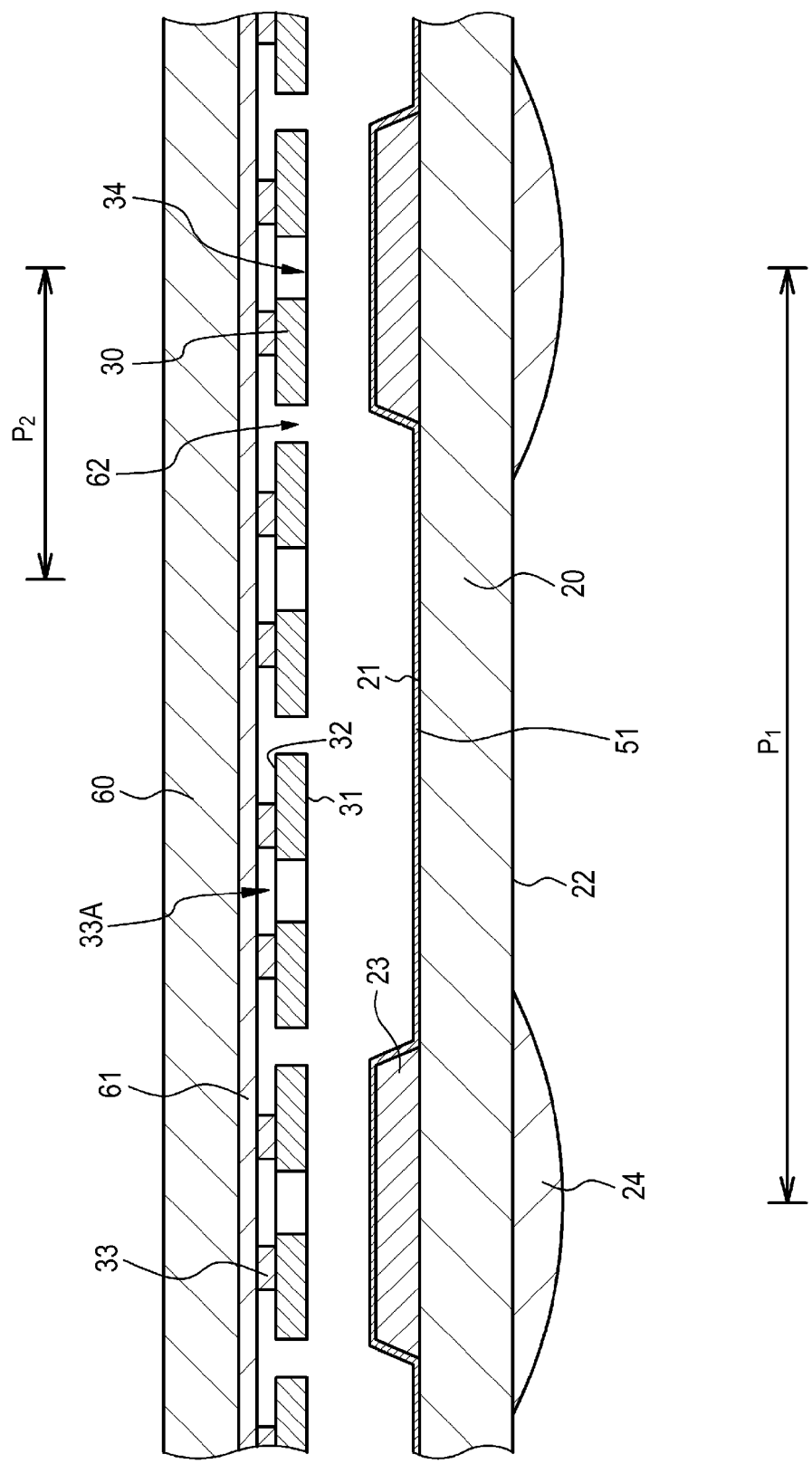
FIG. 4 is a partial cross sectional view of a mount substrate and other components, explaining a light emitting device-light receiving device assembly manufacturing method of Example 1.

Specifically, as described above, the transmissive first adhesive layer 51 of a UV curable adhesive is formed at least on the first base 23. Then, as illustrated in FIG. 4, the mount substrate 20 is mounted on a stage (not illustrated) with the first surface 21 facing upward. Meanwhile, the light receiving device temporarily fastening substrate 60 is held by a moving arm (not illustrated) with the light receiving device 30 facing downward. The moving arm, capable of moving in X, Y, and Z directions and having a variable angle θ with respect to the horizontal plane, is then moved to place the light receiving device 30 above the first base 23.

Figure 5:
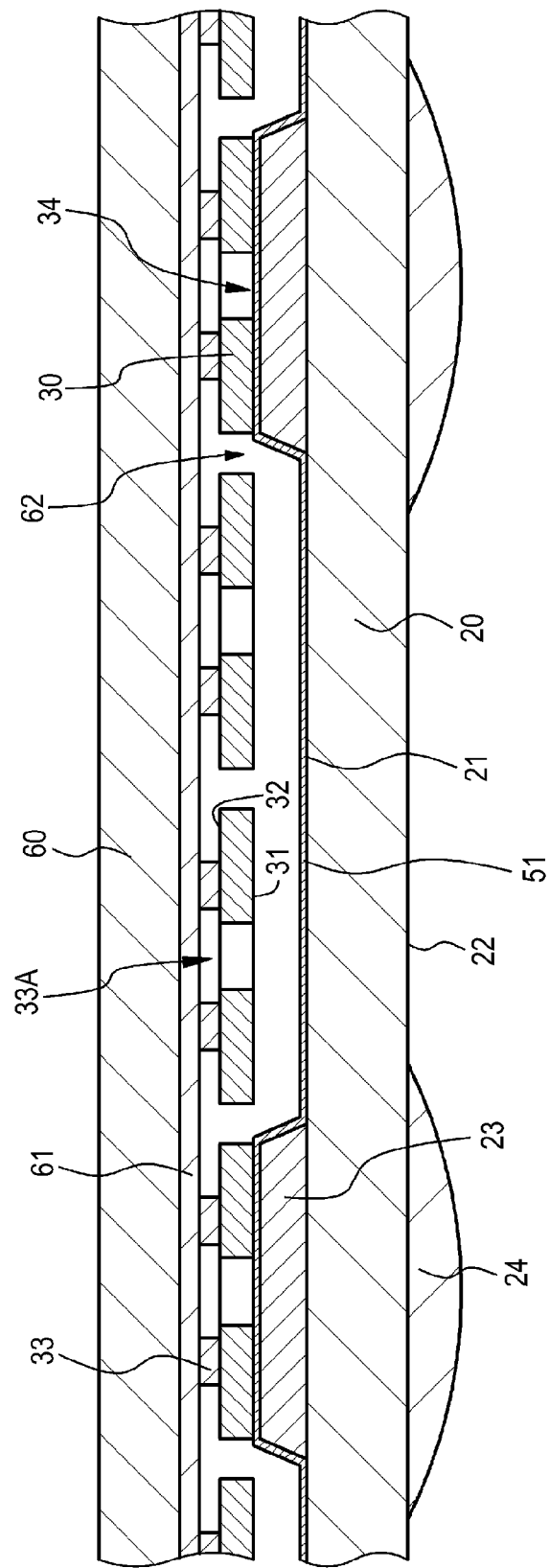
FIG. 5 is a partial cross sectional view of the mount substrate and other components, explaining the light emitting device-light receiving device assembly manufacturing method of Example 1 as a continuation from FIG. 4.

The moving arm is then moved downward to mount the light receiving device 30 on the first adhesive layer 51 formed on the first base 23, and the light receiving device 30 is disposed on the first base 23 as a result (see FIG. 5).

Figure 6:
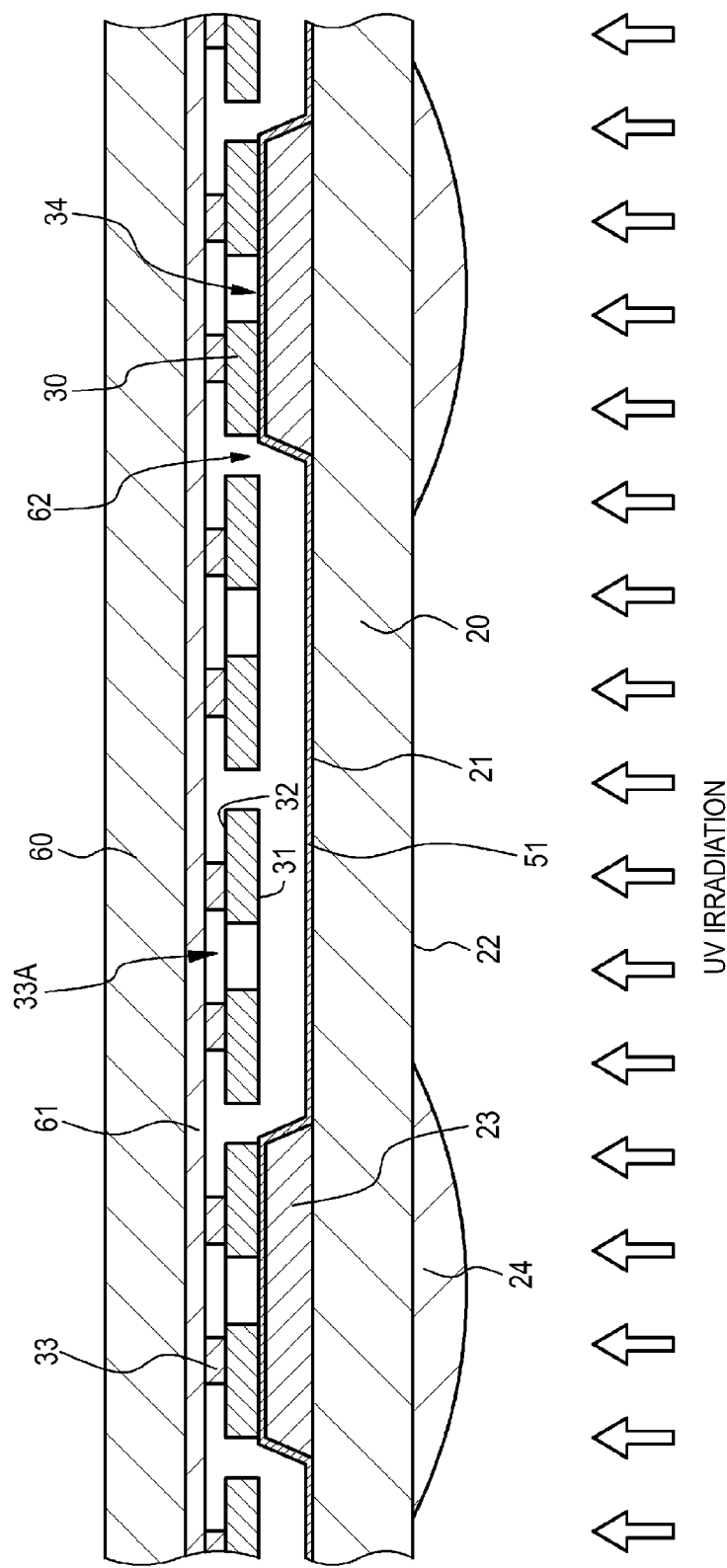
FIG. 6 is a partial cross sectional view of the mount substrate and other components, explaining the light emitting device-light receiving device assembly manufacturing method of Example 1 as a continuation from FIG. 5.

Thereafter, as illustrated in FIG. 6, the first adhesive layer 51 between the light receiving device 30 and the first base 23 is cured by ultraviolet rays via the lens 24 and the mount substrate 20 using a ultraviolet light source (not illustrated). Note that the light receiving device 30 can be disposed on the first base 23 only by using the tackiness of the first adhesive layer, when the transmissive first adhesive layer having tackiness is used in place of the UV curable adhesive.

Figure 7:
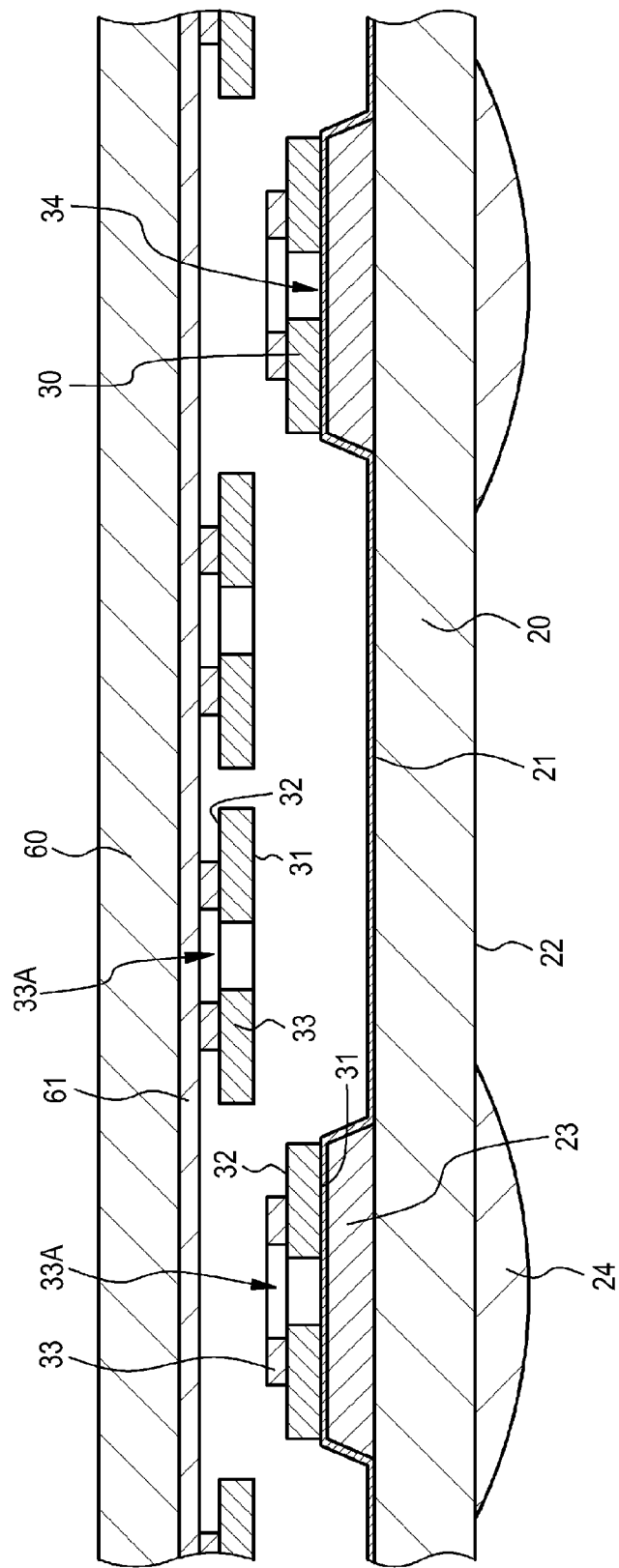
FIG. 7 is a partial cross sectional view of the mount substrate and other components, explaining the light emitting device-light receiving device assembly manufacturing method of Example 1 as a continuation from FIG. 6.

The moving arm is then moved upward to separate the light receiving device 30 so disposed from the light receiving device temporarily fastening substrate 60 (see FIG. 7). The light receiving device 30 is bonded to the first base 23 by the first adhesive layer 51 that has undergone curing, and thus easily detaches itself from the tacky layer 61. The light receiving devices 30 remaining on the light receiving device temporarily fastening substrate 60 are used for the manufacture of the next light emitting device-light receiving device assembly.

An exposure mask may be disposed between the mount substrate 20 and the ultraviolet light source when the first adhesive layer 51 between the light receiving device 30 and the first base 23 needs to be selectively cured by ultraviolet rays via the lens 24 and the mount substrate 20.

[Step-120]

Every $m_3$ light emitting devices 40 are disposed on the second base 33 provided on the second surface 32 of the light receiving device 30, and the light emitting devices 40 so disposed are removed from the light emitting device temporarily fastening substrate 70.

Specifically, the second adhesive layer 52 of a thermosetting adhesive is formed at least on the second base 33. More specifically, in Example 1, the second adhesive layer 52 is formed by spin coating over the second base 33 and the first surface 21 of the mount substrate 20 (over the whole surface). Note that the light emitting device 40 may be disposed only on a specific second base 33 by applying the second adhesive layer 52 only on a specific second base 33 using methods such as a printing method.

Figure 8:
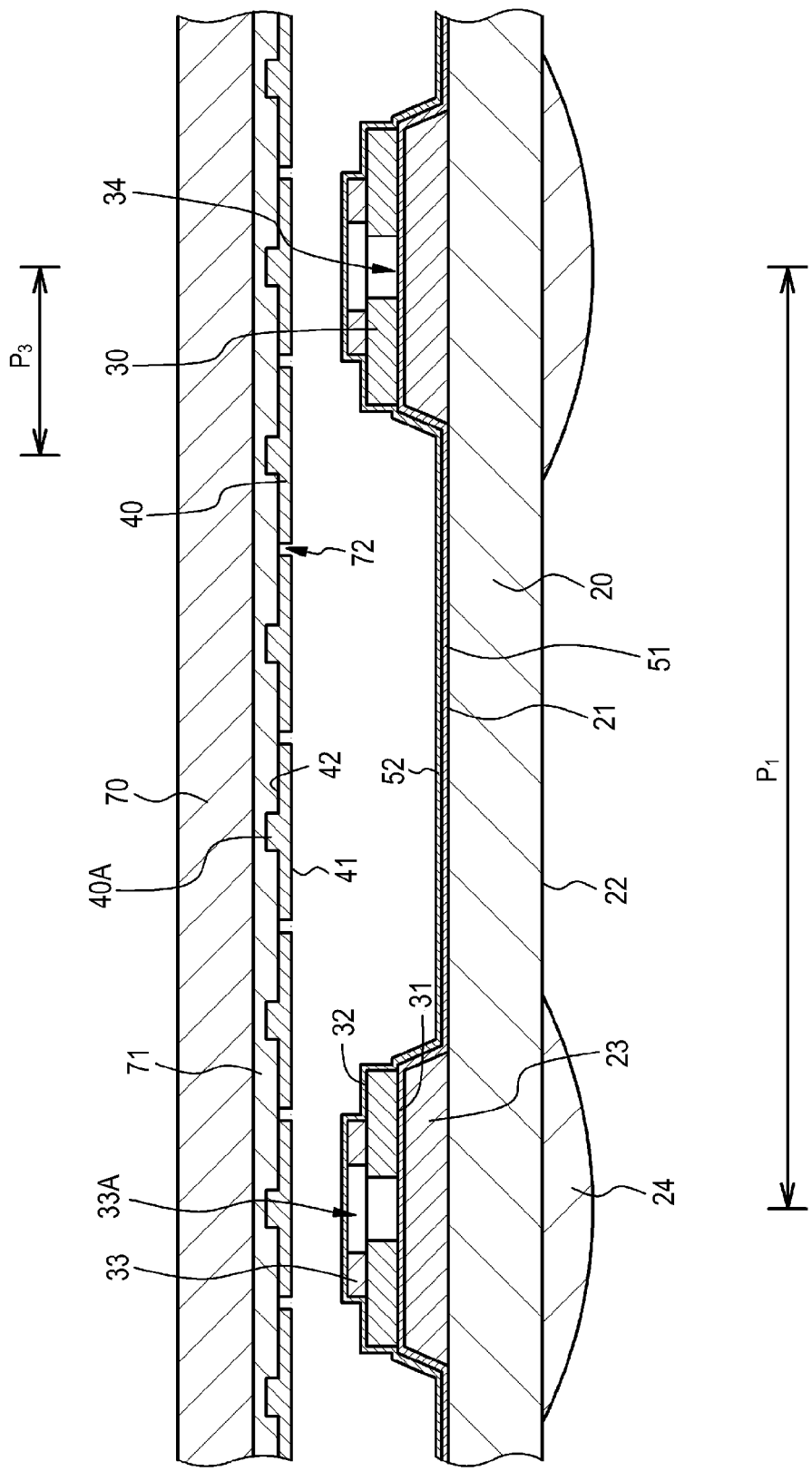
FIG. 8 is a partial cross sectional view of the mount substrate and other components, explaining the light emitting device-light receiving device assembly manufacturing method of Example 1 as a continuation from FIG. 7.

Then, as illustrated in FIG. 8, the light emitting device temporarily fastening substrate 70 is held by a moving arm (not illustrated) with the light emitting device 40 facing downward. The moving arm, capable of moving in X, Y, and Z directions and having a variable angle θ with respect to the horizontal plane, is then moved to place the light emitting device 40 above the second base 33.

Figure 9:
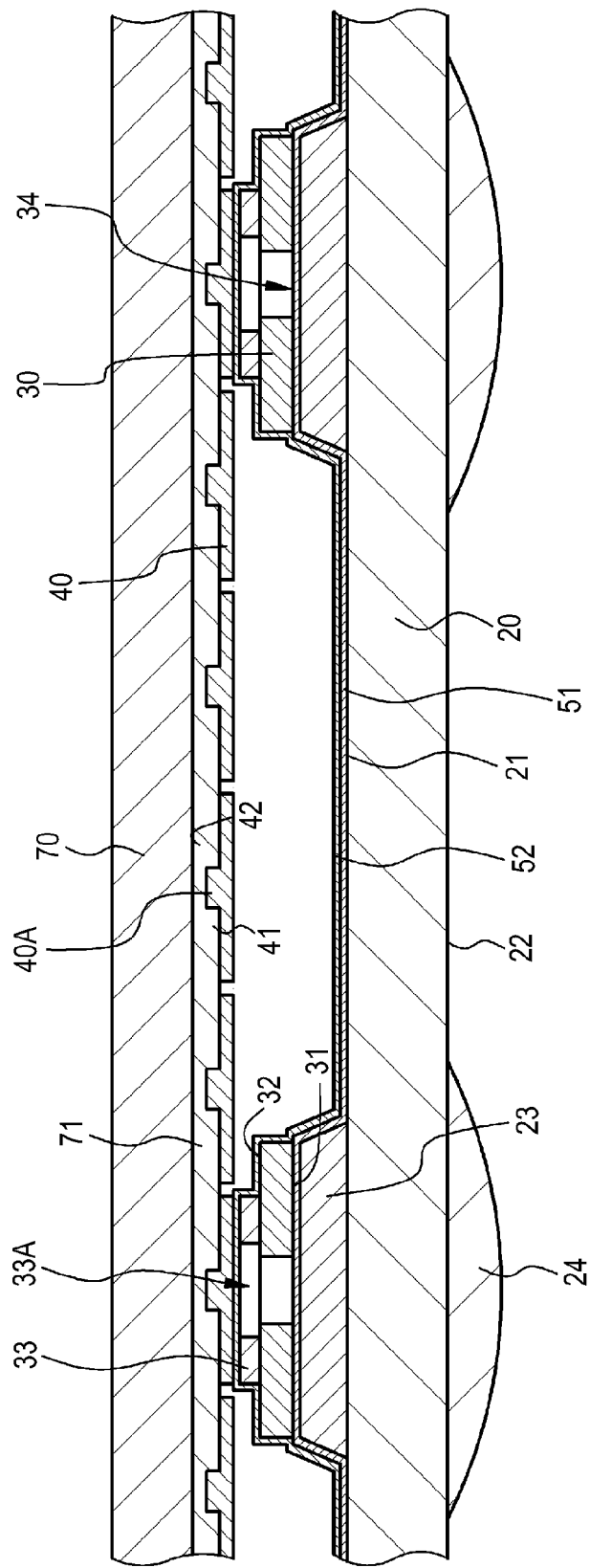
FIG. 9 is a partial cross sectional view of the mount substrate and other components, explaining the light emitting device-light receiving device assembly manufacturing method of Example 1 as a continuation from FIG. 8.

The moving arm is then moved downward to mount the light emitting device 40 on the second adhesive layer 52 formed on the second base 33, and the light emitting device 40 is disposed on the second base 33 as a result (see FIG. 9).

Figure 10:
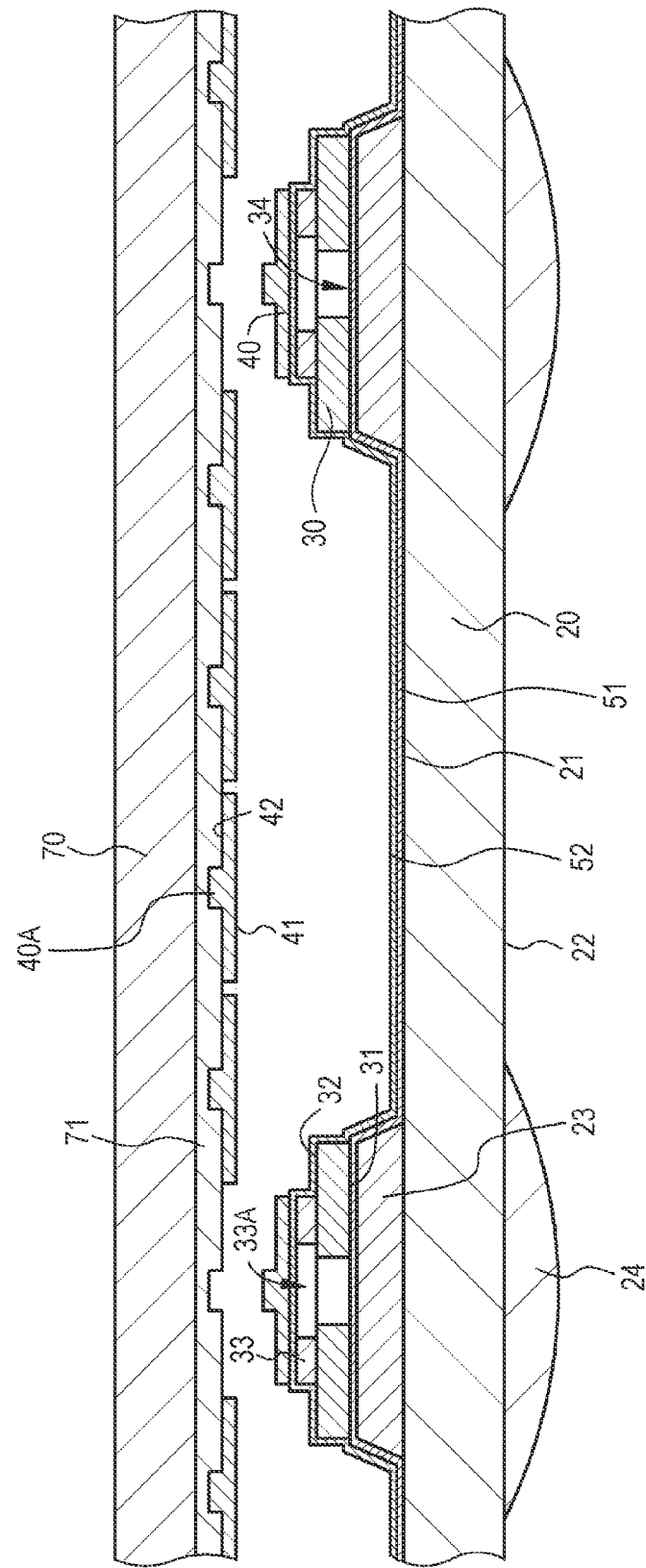
FIG. 10 is a partial cross sectional view of the mount substrate and other components, explaining the light emitting device-light receiving device assembly manufacturing method of Example 1 as a continuation from FIG. 9.

Thereafter, the moving arm is moved upward to separate the light emitting device 40 from the light emitting device temporarily fastening substrate 70 (see FIG. 10). The light emitting device 40 easily detaches itself from the tacky layer 71 when the second adhesive layer 52 is formed of a material that has stronger adhesion for the light emitting device 40 than the adhesion between the light emitting device 40 and the tacky layer 61. Then, the whole is heated to cure the second adhesive layer 52 and anchor the light emitting device 40 on the second base 33, though the heating depends on the material of the second adhesive layer 52. The light emitting devices 40 remaining on the light emitting device temporarily fastening substrate 70 are used for the manufacture of the next light emitting device-light receiving device assembly.

[Step-130]

The insulating layer 53, a non-limiting example of which is polyimide resin, is then formed over the whole surface, and aperture portions that open to the n-side electrode 144 and the p-side electrode 145 of the light emitting device 40, and to the n-side electrode and the p-side electrode of the light receiving device 30 are formed through the insulating layer 53 by, for example, laser processing. The aperture portions are charged with wire material to provide the connection holes 54 and 56, and the pad portions 55 and 56 extending from the connection holes 54 and 56 are provided on the insulating layer 53 to connect the light emitting device 40 and the light receiving device 30 to an external circuit. This may be followed by formation of solder bumps, as required. Specifically, a passivation layer of material such as polyimide resin is formed over the whole surface, and aperture portions are formed through the passivation layer in portions above the pad portions 55 and 56. An UBM (Under Bump Metal) layer as a laminate of a gold layer and a nickel layer is then formed in portions where the pad portions 55 and 56 are exposed at the bottom of the aperture portions. A solder paste of a tin-silver-copper alloy is then formed on the UBM layer by methods such as screen printing to form the solder bumps.

The light emitting device-light receiving device assembly can then be obtained by cutting the mount substrate 20 along a scribe line (not illustrated). The light emitting device-light receiving device assembly is connected to, for example, an interposer via, for example, the solder bumps by flip chip bonding, and electrically connected to, for example, a control semiconductor chip installed in the interposer or the like. The semiconductor chip is, for example, a wafer level CSP (Chip Scale Package).

If the first base 23 is not provided, the light receiving device 30 adjacent to the light receiving device 30 mounted on the first adhesive layer 51 also comes into contact with the first adhesive layer 51. In Example 1, however, as illustrated in FIGS. 5 and 6, the light receiving device 30 adjacent to the light receiving device 30 mounted on the first adhesive layer 51 formed on the first base 23 (raised portion) does not contact the first adhesive layer 51. This ensures that every $m_2$ light receiving devices 30 are reliably anchored to the first base 23. Further, because the adjacent light receiving devices 30 are prevented from contacting the first surface 21 of the mount substrate 20 (more specifically, the first adhesive layer 51), the light receiving devices 30 remaining on the light receiving device temporarily fastening substrate 60 can be used for the manufacture of the next light emitting device-light receiving device assembly without any problem.

If the second base 33 is not provided, the light emitting device 40 adjacent to the light emitting device 40 mounted on the second adhesive layer 52 also comes into contact with the second adhesive layer 52. In Example 1, however, as illustrated in FIG. 8, the light emitting device 40 adjacent to the light emitting device 40 mounted on the second adhesive layer 52 formed on the second base 33 (raised portion) does not contact the second adhesive layer 52. This ensures that every $m_3$ light emitting devices 40 are reliably anchored to the second base 33. Further, because the adjacent light emitting devices 40 are prevented from contacting the second surface 32 of the light receiving device 30 (more specifically, the second adhesive layer 52), the light emitting devices 40 remaining on the light emitting device temporarily fastening substrate 70 can be used for the manufacture of the next light emitting device-light receiving device assembly without any problem.

The light emitting device-light receiving device assembly as an integral unit of the light emitting device 40 and the light receiving device 30 can thus be stably manufactured at high yield. Further, because the light emitting device 40 and the light receiving device 30 are integrated, the light emitting device-light receiving device assembly can be reduced in size and thickness.

Example 2

Figure 3:
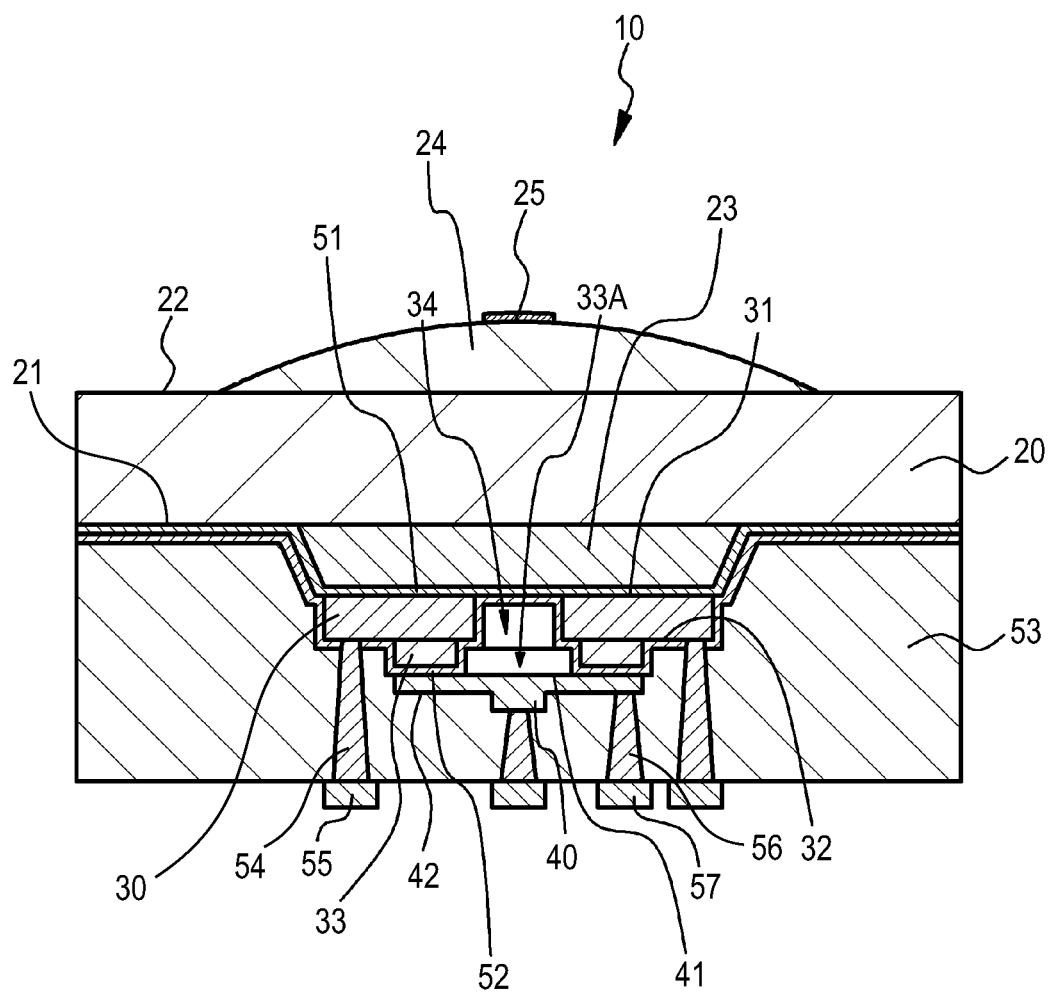
FIG. 3 is a schematic cross sectional view of a light emitting device-light receiving device assembly of Example 2.

Example 2 is a variation of Example 1. As illustrated in the schematic cross sectional view of FIG. 3, the light emitting device-light receiving device assembly of Example 2 includes a light reflecting member 25 at a central portion of the lens 24. A part of the light emitted by the light emitting device 40 emerges to outside through the light passage portion 34 of the light receiving device 30, the first base 23, the mount substrate 20, and the lens 24, and the remaining light from the light emitting device 40 is reflected by the light reflecting member 25 into the light receiving device 30 through the mount substrate 20 and the first base 23. With this configuration, the quantity of the emitted light from the light emitting device 40 can be monitored at the light receiving device 30. The light reflecting member 25 is realized by, for example, an aluminum (Al) layer formed at the central portion on the outer surface of the lens 24. The light emitting device-light receiving device assembly of Example 2 may have the same configuration and structure as the light emitting device-light receiving device assembly of Example 1 except for these points. Further, the light emitting device-light receiving device assembly of Example 2 can be manufactured by using the same method used for the manufacture of the light emitting device-light receiving device assembly of Example 1. Accordingly, no detailed explanations are made.

The present disclosure has been specifically described with respect to certain preferred embodiments and examples. However, the present disclosure is not limited to the foregoing embodiments and examples. The configurations and the structures of the light receiving devices and the light emitting devices, and of the light emitting device-light receiving device assemblies described in the foregoing embodiments and examples are illustrative, and can be appropriately modified. In contrast to FIG. 1 illustrating a single light emitting device-light receiving device assembly 10, a plurality of integral units of the light receiving device 30 and the light emitting device 40 may be arranged on a single mount substrate 20, or the light emitting device-light receiving device assembly 10 may be of a form obtained by connecting a plurality of mount substrates 20 cut and divided into a predetermined shape.

The present disclosure contains subject matter related to that disclosed in Japanese Priority Patent Application JP 2011-072401 filed in the Japan Patent Office on Mar. 29, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device-light receiving device assembly, comprising:
   a mount substrate that has oppositely facing first and second surfaces, the first surface having a raised portion serving as a first base, the raised portion being a portion of the first surface of the mount substrate or a structure on the first surface of the mount substrate that is raised relative to a surrounding remainder of the first surface of the mount substrate;
   a light receiving device that has oppositely facing first and second surfaces, the first surface of the light receiving device being anchored on the first base; and
   a light emitting device,
   wherein,
      the light receiving device is aligned with the first base,
      the light emitting device is aligned with the light receiving device,
      the light receiving device includes a light passage portion that allows for passage therethrough of light emitted by the light emitting device,
      the light emitted by the light emitting device passes through the light passage portion of the light receiving device, the first base, and the mount substrate,
      the light receiving device receives externally incident light passing through the mount substrate and the first base,
      the light receiving device includes an annular second base provided as a raised portion on the second surface of the light receiving device, the raised portion being a portion of the second surface of the light receiving device or a structure on the second surface of the light receiving device that is raised relative to a remainder of the second surface of the light receiving device, and
      the light emitting device is anchored on the second base.

2. The light emitting device-light receiving device assembly according to claim 1, wherein the second base is formed of a metal layer or an alloy layer.

3. The light emitting device-light receiving device assembly according to claim 1, wherein the light emitting device is formed of a surface-emitting laser device.

4. The light emitting device-light receiving device assembly according to claim 3, wherein the surface-emitting laser device is a bottom-emission surface-emitting laser device.

5. The light emitting device-light receiving device assembly according to claim 1, wherein:
   the mount substrate has a lens provided on the second surface of the mount substrate,
   the light emitted by the light emitting device emerges to outside through the light passage portion of the light receiving device, the first base, the mount substrate, and the lens, and
   the light receiving device receives externally incident light through the lens, the mount substrate, and the first base.

6. The light emitting device-light receiving device assembly according to claim 5, wherein:
   the lens has a light reflecting member provided at a central portion of the lens,
   a part of the emitted light from the light emitting device emerges to outside through the light passage portion of the light receiving device, the first base, the mount substrate, and the lens, and
   the remains of the emitted light from the light emitting device are reflected by the light reflecting member into the light receiving device through the mount substrate and the first base.

7. The light emitting device-light receiving device assembly according to claim 5, wherein a center of the lens, a center of the light receiving device and a light emitting device are aligned along a common central axis.

8. The light emitting device-light receiving device assembly according to claim 1, wherein the first base has the same outer shape as the first surface of the light receiving device.

9. The light emitting device-light receiving device assembly according to claim 1, wherein the second base has the same outer shape as the first surface of the light emitting device.

10. The light emitting device-light receiving device assembly according to claim 1, wherein the first surface of the light receiving device is anchored on the first base with a transmissive first adhesive layer.

11. The light emitting device-light receiving device assembly according to claim 1, wherein the light emitting device is anchored on the second base with a second adhesive layer.

* * * * *